(12) United States Patent
Sakui

(10) Patent No.: US 10,381,091 B2
(45) Date of Patent: Aug. 13, 2019

(54) REDUCED VOLTAGE NONVOLATILE FLASH MEMORY

(71) Applicant: MICRON TECHNOLOGY, INC., Boise, ID (US)

(72) Inventor: Koji Sakui, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/008,480

(22) Filed: Jun. 14, 2018

(65) Prior Publication Data

US 2018/0294037 A1 Oct. 11, 2018

Related U.S. Application Data

(60) Continuation of application No. 15/216,160, filed on Jul. 21, 2016, now Pat. No. 10,079,065, which is a division of application No. 13/156,961, filed on Jun. 9, 2011, now Pat. No. 9,424,938.

(51) Int. Cl.
| | |
|---|---|
| *G11C 16/30* | (2006.01) |
| *G11C 11/56* | (2006.01) |
| *G11C 16/12* | (2006.01) |
| *G11C 16/34* | (2006.01) |

(52) U.S. Cl.
CPC .......... *G11C 16/30* (2013.01); *G11C 11/5628* (2013.01); *G11C 16/12* (2013.01); *G11C 16/3418* (2013.01)

(58) Field of Classification Search
CPC ..... G11C 16/12; G11C 16/30; G11C 16/3418; G11C 11/5628
See application file for complete search history.

(56) References Cited

U.S. PATENT DOCUMENTS

| | | |
|---|---|---|
| 5,299,162 A | 3/1994 | Kim et al. |
| 5,440,509 A | 8/1995 | Momodomi et al. |
| 5,442,586 A | 8/1995 | Javanifard et al. |
| 5,469,399 A | 11/1995 | Sato et al. |
| 5,844,841 A | 12/1998 | Takeuchi et al. |
| 5,877,980 A | 3/1999 | Mang et al. |
| 6,009,022 A | 12/1999 | Lee et al. |
| 6,154,412 A | 11/2000 | Ishikawa et al. |
| 6,240,027 B1 | 5/2001 | Lee et al. |
| 6,259,624 B1 | 7/2001 | Nobukata |
| 6,307,807 B1 | 10/2001 | Sakui et al. |
| 6,370,081 B1 | 4/2002 | Sakui et al. |
| 6,429,081 B1 | 8/2002 | Doong et al. |
| 6,512,703 B2 | 1/2003 | Sakui et al. |
| 6,639,864 B2 | 10/2003 | Sundaram et al. |
| 6,657,892 B2 | 12/2003 | Sakui et al. |
| 6,801,458 B2 | 10/2004 | Sakui et al. |
| 7,031,195 B2 | 4/2006 | Sato et al. |

(Continued)

*Primary Examiner* — Vanthu T Nguyen
(74) *Attorney, Agent, or Firm* — Dicke, Billig & Czaja, PLLC

(57) ABSTRACT

Systems include a first semiconductor die comprising a charge pump to generate power supply signals, a second semiconductor die comprising a memory array and programming circuitry, and a bus connected to the first and second semiconductor dies to carry the power supply signals to the programming circuitry. The programming circuitry is adapted to program memory cells of the memory array to respective threshold voltages that are each less than or equal to the first voltage.

20 Claims, 4 Drawing Sheets

(56) References Cited

U.S. PATENT DOCUMENTS

| | | |
|---|---|---|
| 7,099,200 B2 | 8/2006 | Sakui |
| 7,173,850 B2 | 2/2007 | Sakui et al. |
| 7,301,809 B2 | 11/2007 | Sakui et al. |
| 7,319,630 B2 | 1/2008 | Wang et al. |
| 7,332,766 B2 | 2/2008 | Hasegawa et al. |
| 7,333,369 B2 | 2/2008 | Sakui et al. |
| 7,339,822 B2 | 3/2008 | Wang et al. |
| 7,362,614 B2 | 4/2008 | Sakui et al. |
| 7,369,438 B2 * | 5/2008 | Lee ................. G11C 11/005 257/E27.103 |
| 7,388,783 B2 | 6/2008 | Sakui |
| 7,457,166 B2 | 11/2008 | Hemink et al. |
| 7,463,540 B2 | 12/2008 | Sakui et al. |
| 7,483,329 B2 | 1/2009 | Luo et al. |
| 7,508,705 B2 | 3/2009 | Chae et al. |
| 7,626,882 B2 | 12/2009 | Yang et al. |
| 7,675,802 B2 | 3/2010 | Kagan et al. |
| 8,194,456 B2 | 6/2012 | Kim et al. |
| 8,582,363 B2 | 11/2013 | Lee |
| 2003/0048661 A1 | 3/2003 | Sakui et al. |
| 2004/0032788 A1 | 2/2004 | Sakui et al. |
| 2004/0240273 A1 | 12/2004 | Sakui |
| 2005/0041476 A1 | 2/2005 | Sakui et al. |
| 2005/0094431 A1 | 5/2005 | Sato et al. |
| 2005/0218460 A1 | 10/2005 | Hasegawa et al. |
| 2006/0245263 A1 | 11/2006 | Sakui |
| 2007/0127292 A1 | 6/2007 | Sakui et al. |
| 2007/0133282 A1 | 6/2007 | Sakui et al. |
| 2007/0133283 A1 | 6/2007 | Sakui et al. |
| 2008/0212373 A1 | 9/2008 | Hasegawa et al. |

* cited by examiner

REDUCED VOLTAGE NONVOLATILE FLASH MEMORY

RELATED APPLICATION

This Application is a Continuation of U.S. application Ser. No. 15/216,160, titled "REDUCED VOLTAGE NONVOLATILE FLASH MEMORY," filed on Jul. 21, 2016, now U.S. Pat. No. 10,079,065 issued on Sep. 18, 2018, which is a Divisional of U.S. application Ser. No. 13/156,961, titled "REDUCED VOLTAGE NONVOLATILE FLASH MEMORY," filed Jun. 9, 2011, now U.S. Pat. No. 9,424,938 issued on Aug. 23, 2016, which are commonly assigned and incorporated herein by reference.

TECHNICAL FIELD

Subject matter disclosed herein relates to a memory device, and more particularly to flash memory.

BACKGROUND

Flash memories used for embedded applications may comprise two or three transistors per bitline, referred to as 2Tr flash or 3Tr flash, respectively. For example, 3Tr flash may comprise one memory cell transistor and two select gate transistors series connected in a bitline. 2Tr flash may comprise one memory cell transistor and one select gate transistor series which are connected in a bitline. In applications, 3Tr flash memory may be used in pre-pay subway, train, or toll booth cards, monetary cards or cellular phone cards, just to name a few examples. 2Tr flash memory may be used for central or multiple processing unit (CPU or MPU) embedded integrated circuits (IC's), for example.

In a bitline of a 3Tr flash, one memory cell transistor may be sandwiched between two select gate transistors so that the memory cell transistor may be robust against programming disturbances. In one application, by utilizing a page buffer, byte data from an external chip may be overwritten in the page buffer and written to physical memory cells of a plurality of 3Tr flash memory, which may operate like a Byte-EEPROM, for example. Therefore, a memory comprising a plurality of 3Tr flash memory may be used for an application where relatively frequent cycles of reprogramming byte data are involved. Two select gate transistors of 3Tr flash may protect stored data in the memory cell transistor from reprogramming disturbances, for example. A bitline side select gate transistor present in a 3Tr flash memory may not be present in a 2Tr flash memory configuration. In a CPU or MPU embedded chip, 2Tr flash memory may be used as a replacement for mask read-only memory (ROM), for example. In this case, once a reprogramming operation is requested, data of a 2Tr flash memory may be reprogrammed. Therefore, programming disturbance may be avoided. Moreover, a relatively large cell current may be attained by removing a bitline side select transistor in a 2Tr flash memory. As a result, relatively high speed access may be achieved for 2Tr flash memory so as to satisfy CPU or MPU specifications, in contrast to the case for 3Tr flash memory. Both 3Tr and 2Tr flash memory may use a uniform Fowler-Nordheim (FN) tunneling mechanism for erasing and programming operations, which is similar to that of NAND flash.

BRIEF DESCRIPTION OF THE DRAWINGS

Non-limiting and non-exhaustive embodiments will be described with reference to the following figures, wherein like reference numerals refer to like parts throughout the various figures unless otherwise specified.

DETAILED DESCRIPTION

Figure 1:
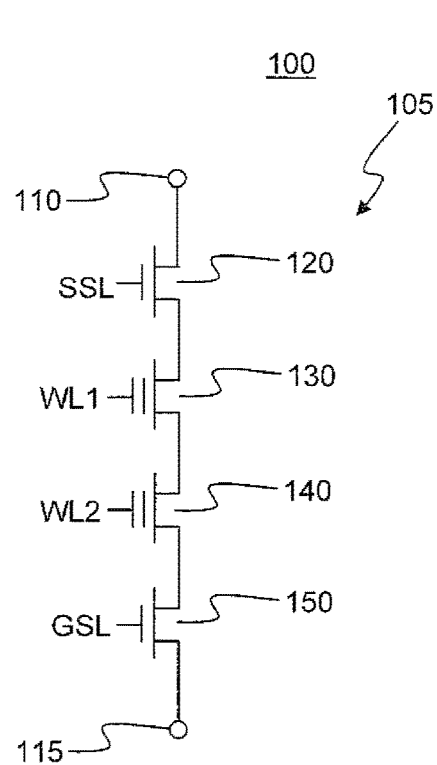
FIG. 1 is a schematic diagram of a portion of a four-transistor flash memory, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a nonvolatile semiconductor memory may comprise a reduced-voltage flash memory that includes bitlines having a number of transistors connected in series that are sandwiched between select gate transistors. A reduced-voltage flash memory may operate using voltages lower than that used for other types of flash memory. For example, a read voltage of a reduced-voltage flash memory may be less than or equal to an operating voltage of the reduced-voltage flash memory. In contrast, a read voltage of other types of flash memory may be substantially greater than an operating voltage of the flash memory, according to the number of bits stored in a physical memory cell.

Flash memory may be used for embedded systems or applications. For example, an embedded system may comprise a computer platform designed to perform one or a few dedicated functions, which may have real-time computing constraints. Such a computer platform may be embedded as part of a complete device including hardware or mechanical parts. Embedded systems may range from portable devices such as radio-frequency identification (RFID) devices or pay cards and MP3 players to large stationary installations like traffic lights or factory controllers, just to name a few examples.

In a particular implementation, a flash memory may include n transistors per bitline, where n is an integer greater than or equal to 4. In particular, a single bitline may comprise n−2 memory cell transistors and two select gate transistors sandwiching the n−2 memory cell transistors in a series configuration. Such a flash memory may be referred to as nTr flash. For particular examples, a flash memory comprising four or six transistors per bitline may be referred to as 4Tr flash or 6Tr flash, respectively. For example, 4Tr flash may comprise two memory cell transistors and two select gate transistors per bitline. 6Tr flash may comprise four memory cell transistors and two select gate transistor per bitline. Though two or four memory cells transistors per bitline are described, other numbers of memory cell transistors may be included, such as three, or five or more, for example. As the number of memory cell transistors increases beyond four or five, however, operating speed may be slowed because read cell current may be reduced by the series resistance of pass transistors in a string. For example, a cell read current for a NAND string that includes 64 memory cells sandwiched by two select gates may be below about 0.1 micro-amps, whereas a current for a 3Tr flash may be substantially larger. A programming mechanism comprising Fowler-Nordheim tunneling may use relatively small write current, for example. Accordingly, the number of memory cell transistors per bitline may be kept below about ten, for example, though this number is merely a general guideline and claimed subject matter is not so limited. In contrast, flash memory such as NAND or NOR flash may comprise 64 or more transistors per bitline.

In an embodiment, memory cells in nTr flash memory may have a stacked gate structure comprising a floating gate and a control gate, as described in detail below (FIG. 4, for example). nTr flash memory may comprise a single semiconductor chip or die including, among other things, a memory cell array having bitlines of n–2 memory cells and two select transistors sandwiching the n–2 memory cells. In one implementation, the single die of an nTr flash memory may exclude a charge pump. Such a charge pump may instead be located external to the nTr flash memory die. A charge pump may be used to boost voltage levels used for read or write operations, for example, above an operating voltage of a memory, as explained in further detail below. In an embodiment, a charge pump need not be used to operate an nTr flash memory. Eliminating a use or need for a charge pump may provide a number of advantages. For example, chip size of nTr flash memory may be reduced compared to the case where charge pumps are included on a same die as nTr flash memory. Also, power consumption during read operations may be reduced, for example. In a particular implementation, a single die of an nTr flash memory may include a voltage regulator, which may be used, among other things, to reduce voltage levels of signals supplying power to the flash memory, as described in further detail below. Of course, such details of an nTr flash memory are merely examples, and claimed subject matter is not so limited.

In an embodiment, a method of operating an nTr flash memory may comprise programming one or more memory cells so that a highest programmed threshold voltage is less than an operating voltage of the one or more multilevel memory cells. Such a method may further comprise reading information from selected memory cells by applying a pass gate voltage to wordlines of the memory cells which is less than the operating voltage. In an example, a NAND specification may specify values for supply voltage: Vcc=3.3V, a lower value of Vcc=2.7V, Typical Vcc=3.3V, an upper value of Vcc=3.6V. In an embodiment, an operating voltage may comprise 3.3V, which may be similar to that of a supply voltage, for example. In an implementation, memory cells may comprise multilevel memory cells that store two or more bits of information, for example, as described in further detail below. As mentioned above, an nTr flash memory may operate in an embedded application, though claimed subject matter is not so limited.

In another embodiment, a method of operating an nTr flash memory may comprise reducing a voltage of a power supply signal to a lower voltage write signal using a voltage regulator included in or on a memory die that comprises the nTr flash memory. The power supply signal may be provided to the memory die from a source external to the memory die, for example. Such a method may further comprise applying the lower voltage write signal to a memory cell on the memory die to program the memory cell so that a highest programmed threshold voltage is less than an operating voltage of the memory cell. In one implementation, the operating voltage may be provided to the memory die from the same source that provides the power supply signal, though claimed subject matter is not so limited. Such a source may comprise a battery and/or a DC-DC converter circuit, for example. nTr flash memory may be programmed using channel hot-electron injection to generate electron-hole pairs by a relatively lower electrical field in comparison with that of Fowler-Nordheim tunneling, for example.

Such a method of operating an nTr flash memory may further comprise reading information from a memory cell by applying a pass gate voltage to wordlines of one or more unselected memory cells less than the operating voltage of the memory cells. Memory cells, which may comprise single level or multilevel memory cells, may be programmable via a Fowler-Nordheim (F-N) tunneling mechanism, for example.

FIG. 1 is a schematic diagram of portion 100 of a 4Tr flash memory according to an embodiment. Memory portion 100 may comprise a memory unit 105 electrically connected between a bitline terminal 110 and a sense amplifier terminal 115, for example. Memory unit 105 may comprise a NAND electrically erasable programmable read only memory (EEPROM) having two memory cells, though claimed subject matter is not limited to such a number or type of memory cells. A plurality of such memory units may comprise a memory array, for example. 4Tr flash memory may comprise two memory cell transistors 130, 140 and two select gate transistors 120, 150 connected in series, per bitline. Gate electrodes of memory cells 130 and 140 may be connected to wordlines WL1 and WL2, respectively. A gate electrode of select gate transistor 120 may be connected to a select gate line SSL on the bitline side of memory unit 105, and a gate electrode of select gate transistor 150 may be connected to a select gate line GSL on the source side of memory unit 105. A process of reading from or writing to memory cells such as 130 or 140, which may be similar to that for a 6Tr flash memory, is described below for a 6Tr flash memory shown in FIG. 2.

Figure 2:
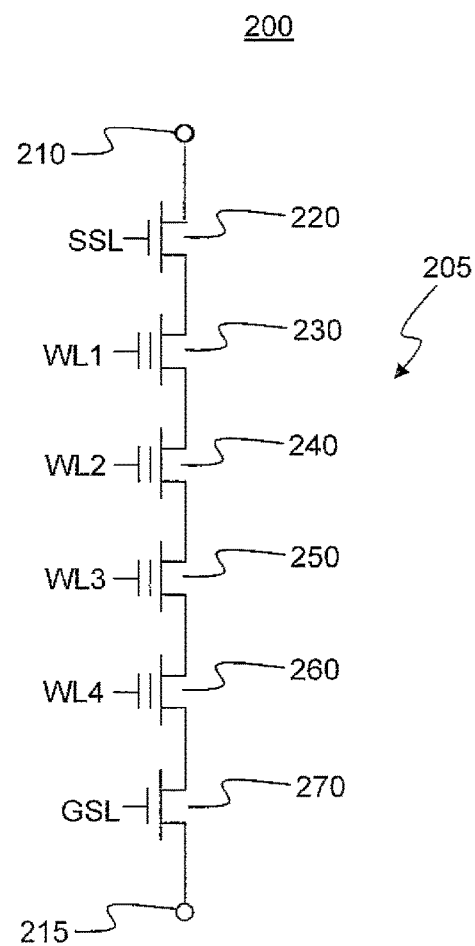
FIG. 2 is a schematic diagram of a portion of a six-transistor flash memory, according to an embodiment.

FIG. 2 is a schematic diagram of a portion 200 of a six transistor flash memory, according to an embodiment. Memory portion 200 may comprise a memory unit 205 electrically connected between a bitline terminal 210 and a sense amplifier terminal 215, for example. Memory unit 205 may comprise a NAND EEPROM having four memory cells, though claimed subject matter is not limited to such a number of memory cells. A plurality of such memory units may comprise a memory array, for example. 6Tr flash memory may comprise four memory cell transistors 230, 240, 250, 260 and two select gate transistors 220, 270 connected in series, per bitline. Gate electrodes of memory cells 230, 240, 250, 260 may be connected to wordlines WL1, WL2, WL3, and WL4, respectively. A gate electrode of select gate transistor 220 may be connected to a select gate line SSL on the bitline side of memory unit 205, and a gate electrode of select gate transistor 250 may be connected to a select gate line GSL on the source side of memory unit 205.

In an implementation, an erase operation may comprise applying a ground potential to a selected control gate line of a memory cell in a memory unit. In the examples that follow, referring to FIG. 2, such a selected control gate line may comprise wordline WL2 of memory cell 240 in memory unit 205, for example. Unselected control gate lines of unselected memory cells may be set to a floating state by applying a high-impedance condition to wordlines WL1, WL3, and WL4. Select gate lines SSL and GSL may also set to a floating state. An erase pulse (e.g., having a magnitude of about 21 volts) may then be applied to a bulk substrate (similar to that shown in FIG. 4) of a memory die containing the flash memory. At this time, an erase pulse (e.g., having a magnitude of about 21 volts) may be applied between the bulk substrate and the control gate line of the memory cell. Electrons in the floating gate of the selected memory cell may then migrate to the bulk substrate as a result of F-N tunneling. Of course, claimed subject matter is not limited to such details of an example of an erase process.

In an implementation, a program operation my comprise setting the source-side gate line GSL in memory unit 205 at a ground potential. Gate line SSL on the drain side may be set at a power supply potential Vcc. As a result, select transistor 270 on the source side of memory unit 205 may be turned off, and select transistor 220 on the drain side of memory unit 205 may be turned on. Bitline contact 210 may be set at a ground potential and channel potentials of memory cells 230, 240, 250, and 260 may be at a ground potential to program memory cell 240 to logic "0". Bitline contact 210 may be set at a power supply potential Vcc and channel potentials of memory cells 230, 240, 250, and 260 may be pre-charged to Vcc-Vth to program memory cell 240 to a logic "1", where Vth is a threshold voltage of the select transistor 220. Next, control gate lines of memory cells 230, 240, 250, and 260 may be set at a power supply potential Vcc (e.g., 3.3 volts) or a potential Vread, which may be less than or equal to Vcc, to be applied to unselected control gate lines in a read mode, as described below. To program memory cell 240 to a "0" logic state, the potential of the selected control gate line WL2 may then be increased from Vcc or Vread to a program potential Vprog (e.g., 18.0 volts). At this time, in the selected memory cell 240, a relatively large potential difference may be produced between the channel (e.g., at ground potential) and the control gate line WL2 (e.g., at Vprog), and electrons may be injected from the channel to the floating gate due to F-N tunneling, for example. Selected memory cell 240 may then be programmed to a "0" logic state. To program memory cell 240 to a "1" logic state, the potential difference between the channel and control gate line WL2 may be relatively small by boosting the channel by charge-coupling of the control gate line WL2 because the channel may be initially pre-charged to Vcc-Vth, for example. As a result, electron injection into the floating gate by F-N tunneling may be suppressed. Thus, selected memory cell 240 may remain in an erased state and programmed to logic "1". Of course, claimed subject matter is not limited to such details of an example of a program process.

In an implementation, a read operation my comprise applying a potential of about 0.0 volts to selected control gate line WL2, after bitline contact 210 is charged to a pre-charge potential. A power supply potential Vcc (e.g., 3.3 volts) or a read potential Vread, which may be less than or equal to Vcc, may be applied to unselected control gate lines WL1, WL3, and WL4 and gate lines SSL and GSL. A potential of 0.0 V may be applied to control gate lines and select gate lines in unselected memory units (not shown), for example. At this time, selected transistors in memory unit 205 may be turned on. Unselected memory cells 230, 250, and 260 may be turned on independently of data value (e.g., regardless of stored logic level). However, selected memory cell 240 may be turned on or off in accordance with data value. If logic "1" is programmed in selected memory cell 240 (e.g., memory cell 240 is in an erase state), the threshold voltage of selected memory cell 240 may be in a negative depletion mode. Accordingly, a cell current may flow to selected memory cell 240 to decrease the potential at bitline contact 210. Conversely, if "0" data is programmed in selected memory cell 240, the threshold voltage of selected memory cell 240 may be in a positive enhancement mode. Accordingly, no substantial cell current may flow to selected memory cell 240, and bitline contact 210 may be maintained at a precharge potential. In this way, data "0" or "1" may be determined on a basis of whether a cell current flows from bitline contact 210 to source line contact 215, for example. A change in potential of the bitline may be amplified (detected) by a sense amplifier, as described below. Of course, claimed subject matter is not limited to such details of an example of a read process.

As described above, to read a selected memory cell, a read potential Vread less than or equal to Vcc may be applied to control gate lines (e.g., WL1, WL3, and WL4) of unselected memory cells. Accordingly, unselected memory cell transistors 230, 250, and 260 may operate as pass transistors (e.g., turned on) while selected memory cell transistor 240 may be selected for reading. As discussed above, it may be desirable to avoid having a charge pump located on a memory die. If the highest programmed threshold voltage of memory cell transistors is maintained below a power supply voltage Vcc, then such a charge pump may be avoided. Maintaining programmed threshold voltages below Vcc may lead to pass gate voltages at or below the power supply voltage Vcc. Accordingly, the highest programmed threshold voltage may be controlled at a voltage below Vcc.

For MLC reading, at least three cycles of sensing may be involved. In this case, a bitline may be pre-charged while a particular reading voltage is prepared to be applied to a selected control gate in parallel, which may shorten the total reading period. A capacitive-resistive (CR) time constant of a select gate line may be smaller than that of a control gate line by lowering the select gate line resistance via shunting at least a portion of the line resistance using metal and/or another conductor, for example. Thus, voltage of a select gate line may be selected to increase just as soon as the bitline and control gate are pre-charged.

Figure 3:
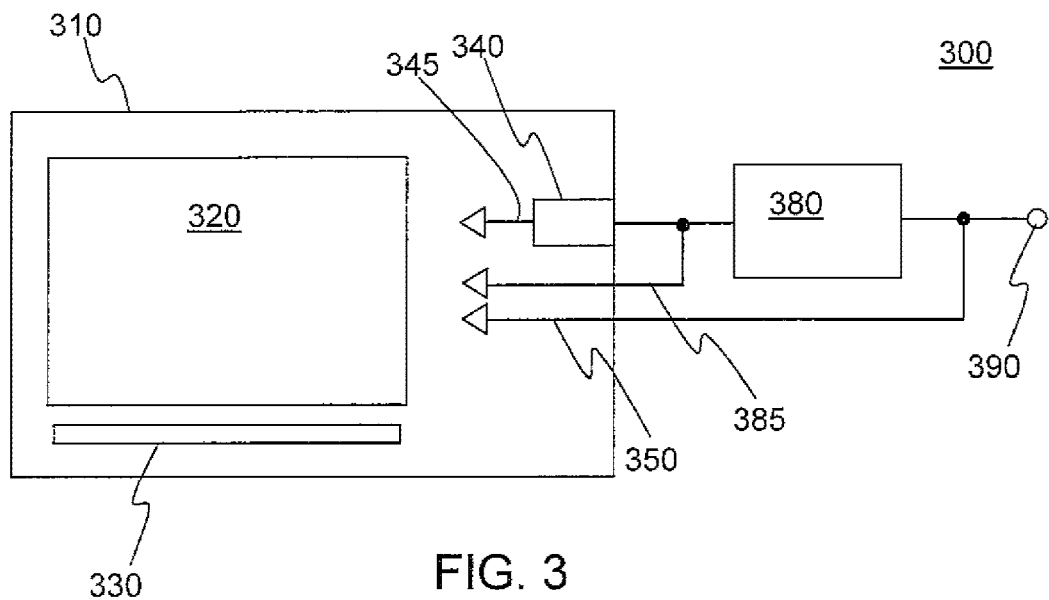
FIG. 3 shows a block diagram of a flash memory system, according to an embodiment.

FIG. 3 shows a block diagram of a flash memory system 300, according to an embodiment. A single memory die 310 may comprise a semiconductor substrate including doped and undoped portions of silicon, germanium, or other semiconductor material, for example. Various structures including electronic components, conducting lines (e.g., bitlines, wordlines), and so on may be built into die 310. In particular, memory die 310 may include a flash memory array 320 comprising a plurality of memory units, such as memory units 105 or 205 described above, for example. Bitlines may be connected to memory units on one terminal (e.g., bitline contact 210) while sense amplifier 330 may be connected to another terminal (e.g., contact 215). Other circuitry, not shown, that may be located in or on memory die 310 may include a row decoder, column decoder, and other circuitry involved in read or write operations of memory array 320, for example.

Flash memory system 300 may include a power source (not shown) to supply a first voltage at a terminal 390, which is external to memory die 310, and on line 350 leading to a terminal in or on memory die 310. A charge pump 380 located external to memory die 310 may provide a second voltage higher than the first voltage on line 385 leading to a terminal in or on memory die 310. The second voltage may be provided to a voltage regulator 340, which may or may not be located in or on memory die 310. Voltage regulator 340 may provide a third voltage lower than the second voltage on line 345 leading to a terminal in or on memory die 310. In one implementation, for example, a first voltage may comprise a power supply voltage Vcc of about 3.3 volts, a second voltage may comprise an erase voltage of about 21.0 volts, and a third voltage may comprise a program potential Vprog of about 18.0 volts, though claimed subject matter is not so limited.

In one implementation, voltage regulator 340 may reduce a relatively high voltage signal 385 to a lower write voltage signal 345, wherein the high voltage signal may be provided to memory die 310 from a source, such as charge pump 380, for example, external to the memory die. The lower write voltage 345 may be applied to one or more memory cells in the memory array to program the memory cells such that a highest programmed threshold voltage is of the memory cells is less than an operating voltage of the memory array. Of course, such details of programming memory cells are merely examples, and claimed subject matter is not so limited.

Figure 4:
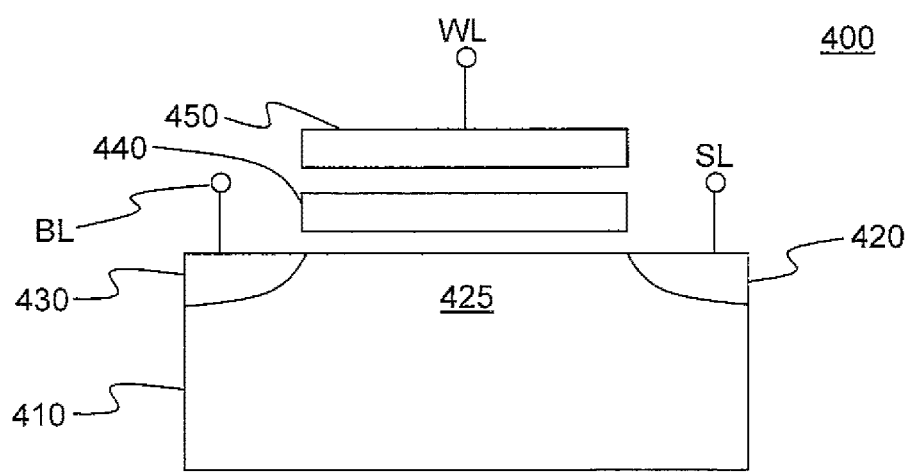
FIG. 4 is a schematic diagram of a stacked gate memory cell, according to an embodiment.

FIG. 4 is a schematic diagram of a stacked gate memory cell 400, according to an embodiment. Flash memory units, such as 100 or 200 described above, may include one or more memory cells that comprise a stacked gate memory cell. In one implementation, select transistors included in flash memory units may also comprise a stacked gate structure that is similar to that of the memory cells.

Memory cell 400 may comprise a control gate 450, a floating gate 440, and a channel region 425, for example. Channel region 425 may be located in a volume of substrate 410 between source 420 and drain 430. Source 420 and drain 430 may comprise doped portions of substrate 410. Memory cell 400 located in a memory array, for example, may include a wordline contact WL connected to control gate 450, a bitline contact BL connected to drain 430, and a source line contact SL connected to source 420. Memory cell 400 may be programmed or erased using F-N tunneling. In particular, memory cell 400 may be programmed, as described above, by removing electrons from floating gate 440 to drain 430 using an F-N tunneling current. Data may be erased, as described above, by injecting electrons from substrate 420 to floating gate 440 using an F-N tunneling current.

Figure 5:
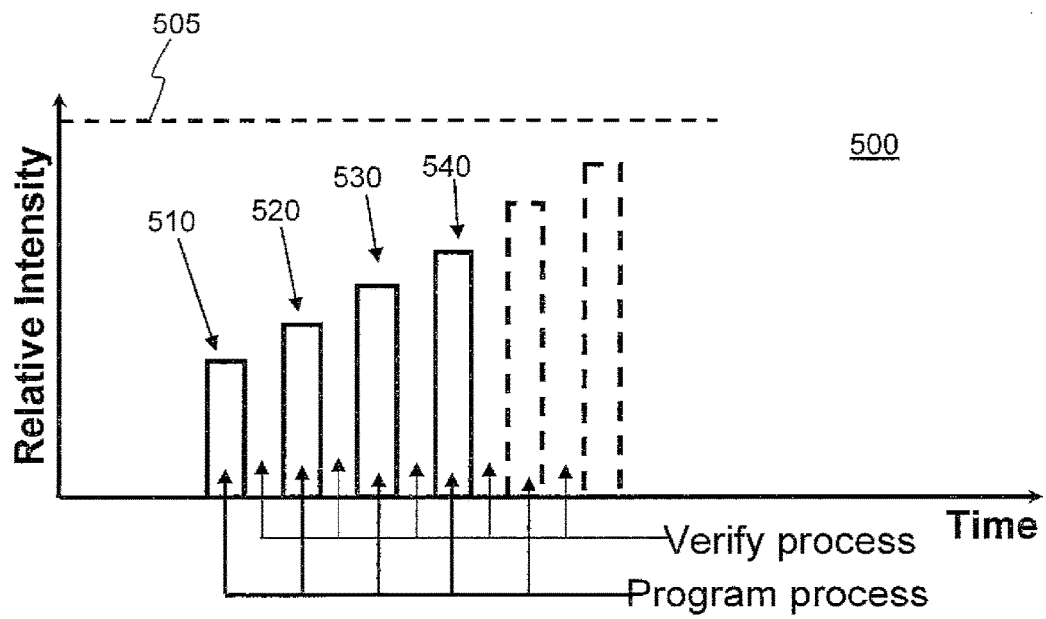
FIG. 5 is a plot of characteristics of a program-verify (PV) signal comprising program step pulses, according to an embodiment.

FIG. 5 is a plot of characteristics of a program-verify (PV) bias signal 500 comprising program step pulses, according to an embodiment. A process of writing to a memory cell in a nTr flash memory may comprise a process to verify that a particular bit was successfully written to the memory cell. In one implementation, such a process may be performed by a microcontroller or memory controller (see FIG. 6). For example, program step pulses and verify processes may be alternately performed during a PV process. In a particular example, a first program pulse may be applied to a memory cell to program the memory cell to a "0" state. A verify process may follow the first program pulse to determine whether or not the memory cell was successfully programmed to a "0" state. If not, then a second program pulse having a higher magnitude than that of the first program pulse may be applied to the memory cell. A verify process may then be repeated, and so on. Such a memory cell may comprise a single level cell or a multi-level cell, for example. In one implementation, an incremental step pulse program (ISPP) process may be used, wherein a magnitude of a program pulse applied to a control gate of a particular memory cell may be sequentially increased until the particular memory cell is determined to be successfully programmed. However, an ISPP process may include an upper level which a highest program pulse may not exceed. Such an upper level may be approximately equal to a power supply voltage Vcc of a nTr flash memory, for example. Accordingly, a highest programmed threshold voltage of a memory cell may be less than an operating voltage of the memory cell array.

In detail, PV bias signal 500 may comprise one or more individual program pulses applied to a memory cell until the memory cell transitions to a programmed state. PV bias signal 500 may comprise a voltage signal applied to a control gate (e.g., a wordline) of memory cells of a nTr flash memory array, for example. In particular, subsequent program pulses may have a greater peak amplitude than a previous program pulse. In one implementation, a series of such program pulses may comprise a waveform having individual peak amplitudes that sequentially increase from one pulse to the next. Such an implementation may address an issue of variability of physical and/or electrical characteristics, such as a coupling coefficient, for example, of a plurality of memory cells in an array. As shown in FIG. 5, a first program pulse 110 may be followed by a second program pulse 120 having a peak amplitude higher than that of the first program pulse. According to an ISPP process, and as mentioned above, a verify process may be performed between consecutive program pulses of PV bias signal 500. Such a verify process may be used to determine whether programming a memory cell using a preceding program pulse was successful or not. For example, first program pulse 510 applied to a memory cell may be followed by a verify process to determine whether the memory cell was successfully programmed by program pulse 510. If so, then PV bias signal 500 may no longer be applied to the memory cell (e.g., subsequent program pulses 520, 530, 540, and so on need not be applied to the memory cell). However, if the memory cell was not successfully programmed, then second program pulse 520, having a peak amplitude higher than that of first program pulse 510 may be applied to the memory cell. As before, second program pulse 520 applied to the memory cell may be followed by a verify process to determine whether the memory cell was successfully programmed by program pulse 520. If so, then PV bias signal 500 may no longer be applied to the memory cell (e.g., subsequent program pulses 530, 540, and so on need not be applied to the memory cell). However, if the memory cell was not successfully programmed, then third program pulse 530, having a peak amplitude higher than that of second program pulse 520 may be applied to the memory cell. Such a process may continue until the memory cell is successfully programmed or an upper voltage level 505, which may approximately equal the power supply voltage Vcc of the nTr flash memory array, is reached. If upper level 505 is reached and the memory cell is not successfully programmed, then the memory cell may be determined to be bad or defective, for example. Such a PV bias signal 500, of course, may comprise a variety of characteristic shapes and/or configurations, and claimed subject matter is not limited in this respect.

Figure 6:
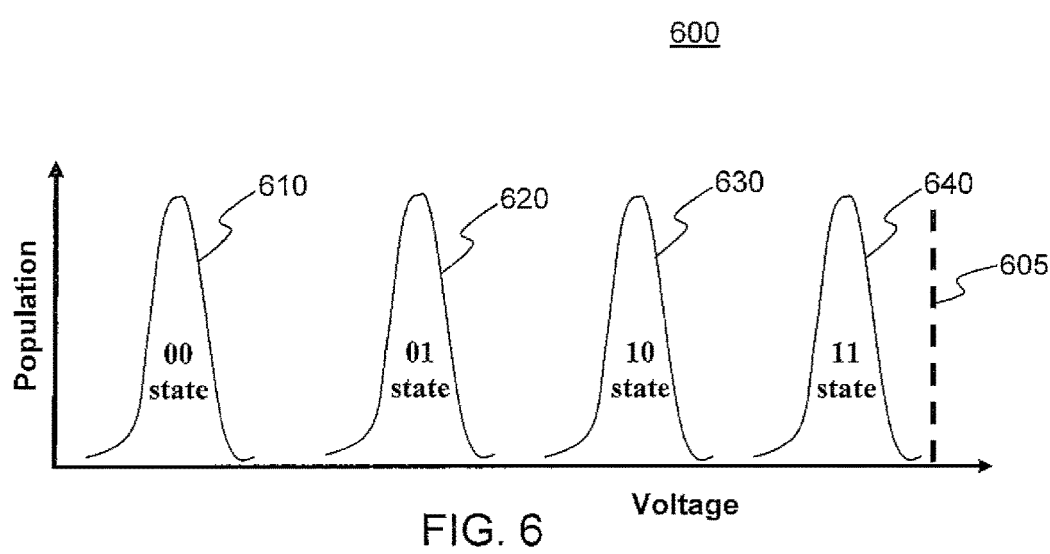
FIG. 6 is a plot showing a distribution of states of memory cells in a flash memory cell, according to an embodiment.

FIG. 6 is a plot showing a distribution 600 of states of multilevel memory cells in a nTr flash memory cell, according to an embodiment. As mentioned above, in a number of applications memory cells in nTr flash memory may comprise multilevel memory cells (MLCs) to store two bits of information. A state distribution of a memory cell, for example, may correspond to one or more threshold voltages corresponding to a number of states or logic levels stored by the memory cell. Individual logic levels may correspond to two-bit data, such as "00" for a first logic level, "01" for a second logic level, "10" for a third logic level, and "11" for a fourth logic level, for example. States or logic levels may correspond to voltage ranges separated by threshold voltages. For example, a first logic level may correspond to a first voltage range 610, a second logic level may correspond to a second voltage range 620, a third logic level may correspond to a third voltage range 630, and a fourth logic level may correspond to a fourth voltage range 640. In an implementation, a highest portion of a highest voltage range 640 may not exceed an upper voltage 605, which may be approximately equal to a power supply voltage Vcc of the nTr flash memory, for example. Accordingly, a highest programmed threshold voltage of a MLC may be less than an operating voltage of the nTr flash memory. Of course, such details describing a distribution of states are merely examples, and claimed subject matter is not so limited.

Figure 7:
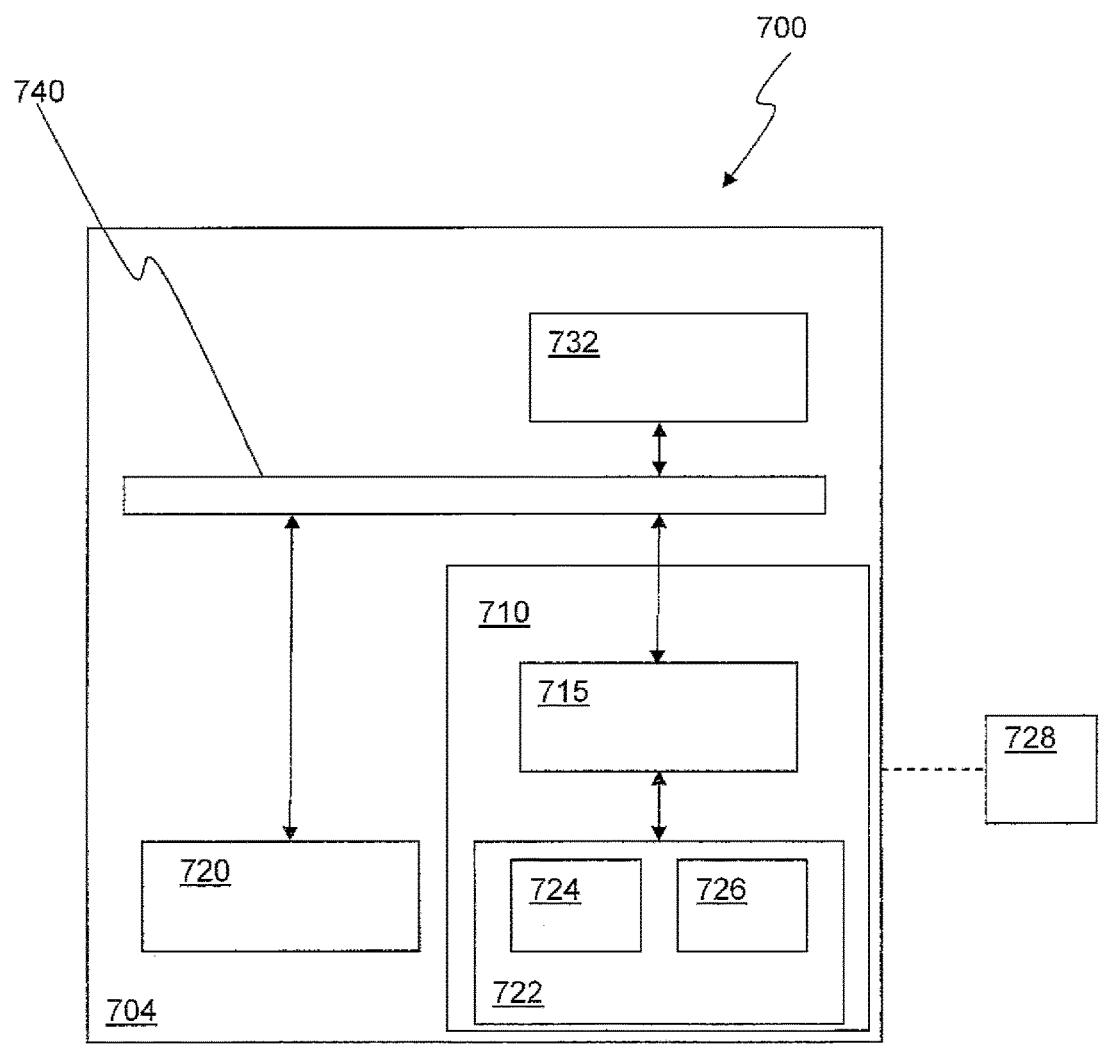
FIG. 7 is a schematic diagram illustrating an exemplary embodiment of a computing system.

FIG. 7 is a schematic diagram illustrating an exemplary embodiment of a computing system 700 including a memory device 710. Such a computing device may comprise one or more processors, for example, to execute an application and/or other code. For example, memory device 710 may comprise an nTr flash memory system, such as 300 shown in FIG. 3. A computing device 704 may be representative of any device, appliance, or machine that may be configurable to manage memory device 710. Memory device 710 may include a memory controller 715 and a memory 722. By way of example but not limitation, computing device 704 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 700, and the processes and methods as further described herein, may be implemented using or otherwise including hardware, firmware, software, or any combination thereof. Thus, by way of example but not limitation, computing device 704 may include at least one processing unit 720 that is operatively coupled to memory 722 through a bus 740 and a host or memory controller 715. Processing unit 720 is representative of one or more circuits configurable to perform at least a portion of a data computing procedure or process. By way of example but not limitation, processing unit 720 may include one or more processors, controllers, microprocessors, microcontrollers, application specific integrated circuits, digital signal processors, programmable logic devices, field programmable gate arrays, and the like, or any combination thereof. Processing unit 720 may include an operating system configured to communicate with memory controller 715. Such an operating system may, for example, generate commands to be sent to memory controller 715 over bus 740. In one implementation, memory controller 715 may comprise an internal memory controller or an internal write state machine, wherein an external memory controller (not shown) may be external to memory device 710 and may act as an interface between the system processor and the memory itself, for example. Such commands may comprise read and/or write commands. In response to a write command, for example, memory controller 715 may provide a signal, such as signal 500 comprising a series of set pulses having individual peak amplitudes that sequentially increase from one pulse to the next, shown in FIG. 5, for example. In one implementation, memory controller 715 may program one or more multilevel memory cells in a nTr flash memory so that a highest programmed threshold voltage is less than an operating voltage of the multilevel memory cells. The memory controller may further read information from selected ones of the multilevel memory cells using a pass gate voltage applied to wordlines of unselected ones of the multilevel memory cells that is less than the operating voltage. In another implementation, memory controller 715 may apply a write voltage signal to a memory cell on a single memory die to program the memory cell so that a highest programmed threshold voltage is less than an operating voltage of the memory cell, wherein the operating voltage is provided to the memory die from a source external to the memory die.

Memory 722 is representative of any data storage mechanism. Memory 722 may include, for example, a primary memory 724 and/or a secondary memory 726. All or a portion of memory 722 may comprise flash memory, as discussed above, for example. Primary memory 724 may include, for example, a random access memory, read only memory, etc. While illustrated in this example as being separate from processing unit 720, it should be understood that all or part of primary memory 724 may be provided within or otherwise co-located/coupled with processing unit 720.

System 700 may further include a processor to host one or more applications and to initiate the read operation.

Secondary memory 726 may include, for example, the same or similar type of memory as primary memory and/or one or more data storage devices or systems, such as, for example, a disk drive, an optical disc drive, a tape drive, a solid state memory drive, etc. In certain implementations, secondary memory 726 may be operatively receptive of, or otherwise configurable to couple to, a computer-readable medium 728. Computer-readable medium 728 may include, for example, any medium that can carry and/or make accessible data, code, and/or instructions for one or more of the devices in system 700.

Computing device 704 may include, for example, an input/output 732. Input/output 732 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 732 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A system comprising:
a first semiconductor die comprising a charge pump configured to receive a first voltage from an external power source and to generate power supply signals;
a second semiconductor die comprising a memory array and programming circuitry;
a bus connected to the first and second semiconductor dies to carry the power supply signals to the programming circuitry; and
a microcontroller to read information from a selected memory cell of the memory array for a read operation by applying a gate voltage less than or equal to the first voltage to wordlines of one or more unselected memory cells of the memory array connected in series with the selected memory cell, wherein the microcontroller is adapted to program two or more bits of information in individual memory cells of the memory array;
wherein the programming circuitry is adapted to program memory cells of the memory array to respective threshold voltages that are each less than or equal to the first voltage;
wherein the programming circuitry is further adapted to program a selected memory cell of the memory array while applying gate voltages less than or equal to the first voltage to wordlines of each unselected memory cell of the memory array connected in series with the selected memory cell; and
wherein the programming circuitry is further adapted to program the selected memory cell of the memory array while applying no voltage greater than the first voltage to each unselected memory cell of the memory array connected in series with the selected memory cell.

2. The system of claim 1, wherein the charge pump comprises a battery and a DC-DC converter circuit.

3. The system of claim 1, wherein the second semiconductor die further comprises a voltage regulator to reduce a voltage level of a power supply signal from the charge pump.

4. The system of claim 1, wherein the voltage regulator is external to the second semiconductor die.

5. The system of claim 1, wherein the charge pump is configured to receive the first voltage at a voltage terminal and to supply a particular power supply signal having a second voltage higher than the first voltage to the second semiconductor die, and wherein the second semiconductor die is configured to receive the first voltage from the voltage terminal and the second voltage from the charge pump.

6. The system of claim 5, wherein the first voltage is a lowest positive voltage for which the second semiconductor die is configured to receive.

7. The system of claim 1, wherein the first voltage is a lowest positive voltage received by the first semiconductor die.

8. The system of claim 7, wherein the second semiconductor die is configured to receive a plurality of voltages higher than the first voltage.

9. The system of claim 1, wherein the second semiconductor die is devoid of a charge pump.

10. The system of claim 1, wherein the memory cells of the memory array are arranged as n-transistor flash memory strings, where n is an integer value less than 12.

11. The system of claim 10, wherein each n-transistor flash memory string of the memory array contains a number of non-volatile memory cells less than or equal to 10.

12. The system of claim 10, wherein each n-transistor flash memory string of the memory array contains a number of memory cells less than or equal to 5.

13. The system of claim 1, wherein the programming circuitry is further adapted to program the memory cells of the plurality of memory cells using channel hot-electron injection.

14. A system comprising:
a first semiconductor die comprising a charge pump configured to receive a first voltage from an external power source and adapted to generate power supply signals;
a second semiconductor die comprising a memory array and programming circuitry and configured to receive the first voltage from the external power source and to receive a power supply signal from the charge pump having a second voltage higher than the first voltage;
a voltage regulator configured to receive a power supply signal from the charge pump having the second voltage and to provide a third voltage to the second semiconductor die; and
a bus connected to the first and second semiconductor dies to carry the power supply signals to the programming circuitry;
wherein the memory array comprises a plurality of memory cells arranged in a plurality of strings of memory cells with each string of memory cells of the plurality of strings of memory cells containing memory cells connected in series between a respective bitline and a sense amplifier;
wherein the third voltage is lower than the second voltage and higher than the first voltage;
wherein the programming circuitry is adapted to program the memory cells of the plurality of memory cells to respective threshold voltages that are each less than or equal to the first voltage;
wherein the programming circuitry is further adapted to program a selected memory cell of the memory array while applying gate voltages less than or equal to the first voltage to wordlines of each unselected memory cell of the memory array connected in series with the selected memory cell; and
wherein the programming circuitry is further adapted to program the selected memory cell of the memory array while applying no voltage greater than the first voltage to each unselected memory cell of the memory array connected in series with the selected memory cell.

15. The system of claim 14, wherein each string of memory cells of the plurality of strings of memory cells contains less than 10 memory cells connected in series.

16. The system of claim 14, wherein the programming circuitry is further adapted to program the memory cells of the plurality of memory cells using channel hot-electron injection.

17. A system comprising:
a first semiconductor die comprising a charge pump configured to receive a first voltage from an external power source and to generate power supply signals;
a second semiconductor die comprising a memory array and programming circuitry and configured to receive the first voltage, wherein the second semiconductor die is devoid of a charge pump, and wherein the first voltage is a lowest positive voltage for which the second semiconductor die is configured to receive;
a bus connected to the first and second semiconductor dies to carry the power supply signals to the programming circuitry; and a microcontroller to read information from a selected memory cell of the memory array by applying a gate voltage less than or equal to the first voltage to wordlines of one or more unselected memory cells of the memory array connected in series with the selected memory cell, wherein the microcontroller is adapted to program two or more bits of information in individual memory cells of the memory array;

wherein the programming circuitry is adapted to program memory cells of the memory array to respective threshold voltages that are each less than or equal to the first voltage;

wherein the programming circuitry is further adapted to program a selected memory cell of the memory array while applying gate voltages less than or equal to the first voltage to wordlines of each unselected memory cell of the memory array connected in series with the selected memory cell; and wherein the programming circuitry is further adapted to program the selected memory cell of the memory array while applying no voltage greater than the first voltage to each unselected memory cell of the memory array connected in series with the selected memory cell.

18. The system of claim 17, wherein the second semiconductor die further comprises a voltage regulator to reduce a voltage level of a power supply signal from the charge pump.

19. The system of claim 17, wherein the first voltage is a lowest positive voltage received by the first semiconductor die.

20. The system of claim 17, wherein the programming circuitry is further adapted to program the memory cells of the plurality of memory cells using channel hot-electron injection.

* * * * *